United States Patent [19]
Cho et al.

[11] Patent Number: 5,448,514
[45] Date of Patent: Sep. 5, 1995

[54] ULTRA HIGH DENSITY DIMER MEMORY DEVICE

[75] Inventors: Kyeongjae Cho, Cambridge; John D. Joannopoulos, Belmont, both of Mass.

[73] Assignee: Massachusetts Institute of Technology, Cambridge, Mass.

[21] Appl. No.: 235,508

[22] Filed: Apr. 29, 1994

[51] Int. Cl.$^6$ ............................................. G11C 13/02
[52] U.S. Cl. .................................... 365/151; 365/153
[58] Field of Search ........... 365/129, 151, 153, 189.01, 365/230.01

[56] References Cited

U.S. PATENT DOCUMENTS 5,091,880  2/1992  Isono et al. .
5,323,375  6/1994  Ihara et al. ............................ 365/151

OTHER PUBLICATIONS

Kleinlman, Leonard, and D. M. Bylander, "Efficacious Form for Model Pseudopotentials", *Physical Review Letters*, vol. 48, No. 20, May 17, 1982, pp. 1425–1428.
Payne, M. C., M. P. Teter, D. C. Allan, T. A. Arias, and J. D. Joannopoulos, "Iterative Minimization Techniques for -Ab Initio Total-Energy Calculations: Molecular Dynamics and Conjugate Gradients", *Reviews of Modern Physics*, vol. 64, No. 4, Oct. 1992, pp. 1045–1097.
Perdew, J. P., and Alex Zunger, "Self-Interaction Correction to Density-Functional Approximations for Many-Electron Systems", *Physical Review B*, vol.23, No. 10, May 15, 1981, pp. 5048–5079.

*Primary Examiner*—Terrell W. Fears
*Attorney, Agent, or Firm*—Samuels, Gauthier & Stevens

[57] ABSTRACT

A memory device having a storage medium including a substrate with a surface configuration having a plurality of asymmetric surface dimers, a device for writing data into the storage medium by modifying the configuration of the surface dimers, and a device for reading the modified configuration of the surface dimers. According to an exemplary embodiment of the present invention, a memory device which utilizes the atomically sharp scanning tip of a scanning tunneling microscope as the writing and reading device, and the (100) surface of a diamond structure (silicon, germanium, or carbon) as the storage medium with surface dimers as the storage units.

12 Claims, 2 Drawing Sheets h = 5.2 h = 3.2 h = 3.95 h = 5.2

ULTRA HIGH DENSITY DIMER MEMORY DEVICE

BACKGROUND OF THE INVENTION

Conventional memory or storage devices have the basic components of a writing and reading device and a storage medium. The storage density of a storage device is determined by the size of a basic storage unit which can store one bit of data. This size is determined by the resolution of the writing and reading device which modifies the storage medium and retrieves the stored data.

One can easily imagine that the ultimate limit of a surface storage density is one bit of data per surface atom, and this limit provides an enormously higher storage density than any conventional storage devices. The realization of this limit requires both a writing and reading device with atomic resolution and a storage medium with a storage unit of atomic scale.

It is therefore an object of the present invention to provide a memory device having an ultra high storage density.

It is a further object of the present invention to provide a memory device which utilizes intrinsic surface atoms of a substrate as data storage units.

SUMMARY OF THE INVENTION

The present invention provides a memory device having a storage medium including a substrate with a surface configuration having a plurality of asymmetric surface dimers, means for writing data into the storage medium by modifying the configuration of the surface dimers; and means for reading the modified configuration of the surface dimers.

According to an exemplary embodiment of the present invention, a memory device is described which closely approaches the ultimate limit in storage density. The device uses the atomically sharp scanning tip of a scanning tunneling microscope or atomic force microscope as the writing and reading device, and the (100) surface of a diamond structure (silicon, germanium, or carbon) as the storage medium with the surface dimer as the storage unit.

DETAILED DESCRIPTION OF THE ILLUSTRATED EMBODIMENTS

Figure 1:
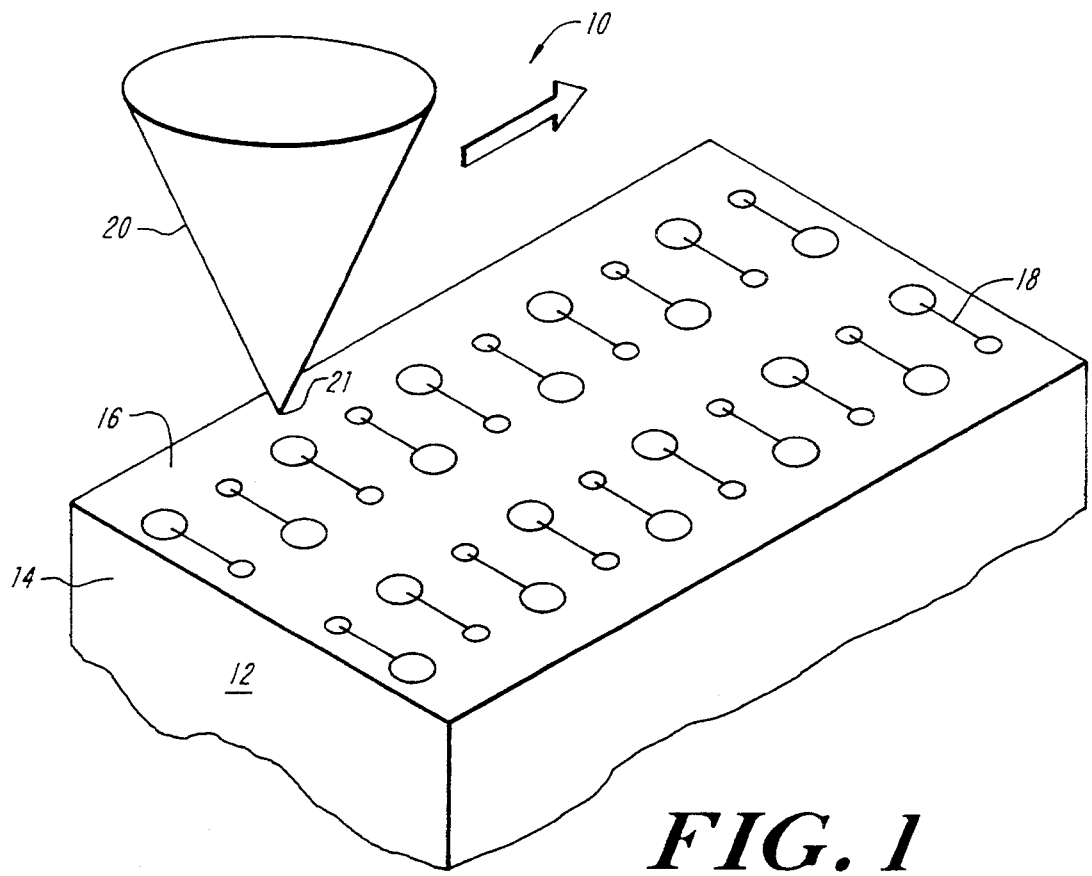
FIG. 1 shows a block diagram of an ultra high density memory device 10 in accordance with the present invention.

With reference to FIG. 1, a block diagram of an ultra high density memory device 10 in accordance with the present invention is illustrated. The memory device 10 includes a storage medium 12 in the form of a substrate 14 with a surface 16 with an atomic configuration which includes a plurality of surface dimers 18. An exemplary embodiment of the present invention uses a diamond structure such as silicon, germanium or carbon having a (100) surface. A tip microscopy device 20 such as a scanning tunneling microscope (STM) or atomic force microscope (AFM) is utilized to write and read data onto the storage medium 12 as will be described hereinafter.

The ultra high density memory device of the present invention relies on the utilization of the interactions between the atomically sharp scanning tip 21 of the device 20 and the surface atoms in the form of dimers 18 on the (100) surface. The tip 21 is utilized to modify the configuration of surface dimers 18 as a writing device, and is also used as a reading device in a standard image scanning mode.

Figure 2A:
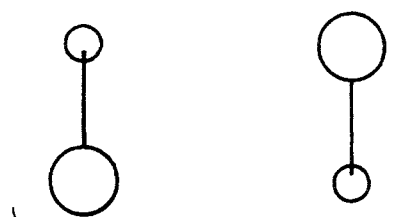
FIGS. 2A and 2B show block diagram configurations of surface dimers.
Figure 2B:
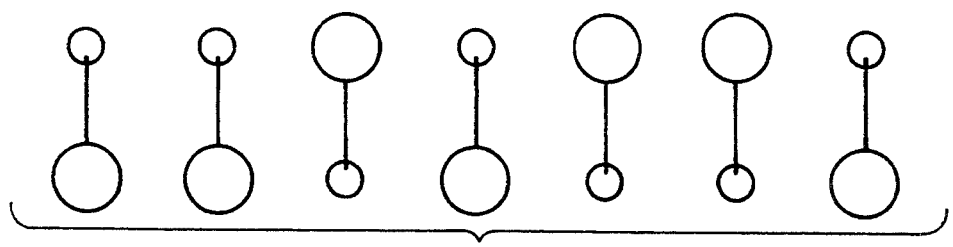

The storage of data on the (100) surface is realized by changing the configuration of a surface dimer 18 between two energetically equivalent asymmetric dimer configurations. One can assign 0 and 1 for each dimer configuration. This is shown schematically in block form in FIGS. 2A and 2B. FIG. 2A shows two different dimer configurations of equivalent energy. The large open circles represent the upper dimer atoms, and the smaller open circles represent the lower dimer atoms. The dimers are represented as the connected unit of large and small circles. When one assigns 0 and 1 for each dimer configuration as in FIG. 2A, a sequence of dimers corresponding to 0010110 is accordingly represented in FIG. 2B. Accordingly, the device 10 can store one bit of information in a surface dimer so that the storage density is one bit per two surface atoms. For silicon, for example, this corresponds to 1 bit per $30\text{Å}^2$ or 420 Gbytes per $mm^2$.

Figure 3A:
FIGS. 3A-3D show the microscopic process of changing the dimer configuration from one to the other in a series of microscopic photographs.
Figure 3B:
Figure 3C:
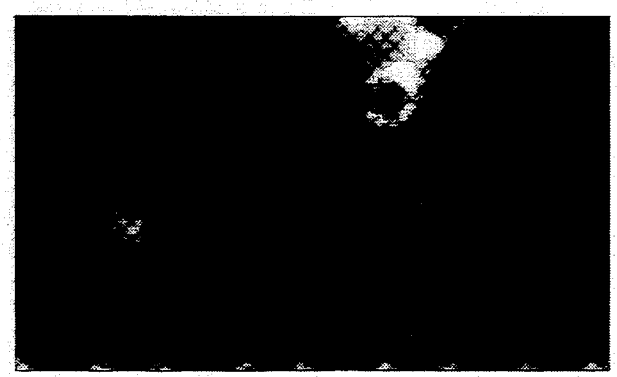
Figure 3D:
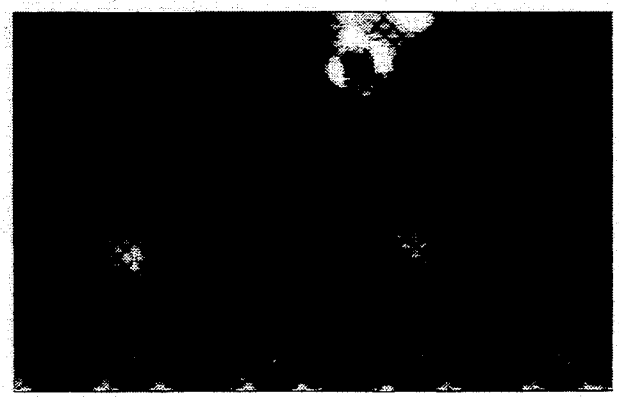

The microscopic process of changing the dimer configuration from one to the other is shown in the series of microscopic photographs of FIGS. 3A-3D. The process of flipping is performed by having the tip pull on a dimer atom rather than push on it. FIGS. 3A and 3B illustrate a tip being brought down to the lower atom of a surface dimer, while FIGS. 3C and 3D show the tip being pulled back to its initial position. The value "h" represents the distance in angstroms between the edge-most tip atom and the surface atom below it. The net effect of this procedure is for the tip to flip a dimer on the surface that remains flipped after the tip is removed.

The memory device 10 in accordance with the present invention preferably includes a low temperature (e.g. for silicon 24K) and a high vacuum chamber. The low temperature condition is preferred to avoid the thermal fluctuations of the dimer configurations. The high vacuum condition is preferred to keep the (100) surface clean from contamination. However, the memory device may operate at a higher temperature (possibly even room temperature) by preparing the (100) surface with surface defects which pin the nearby dimer configurations.

Under the above operative conditions, the storage process and the retrieval process require the scanning rate of one scan per dimer row. In both processes, the scanning tip may be used to scan in any direction above the dimer rows, although a preferred direction would be as illustrated by the directional arrow in FIG. 1. The storage process requires a more complicated motion of the tip along the scanning direction. In order to save a sequence of data bits on a dimer row, the tip should move in such a way that it changes the configurations of the dimers in the row. This change of the configuration is achieved by the following sequence of motions: place the tip above the lower dimer atom, push down the tip until the dimer is captured, pull up the tip until the dimer flips, and proceed to the next dimer. For the given sequence of data bits, the motion of the tip can be programmed and performed very fast.

On the other hand, the retrieval process is rather simple. The tip can scan over the dimer row at a higher distance along a straight line, and the measurement of the tunneling current simply determines the configurations of the dimers.

The tip-surface interactions of an Si(100) surface will now be explained with reference to ab initio total energy pseudopotential calculations. The results of the calculations lead to an understanding of the atomic details associated with the microscopy measurement process.

Both atomic force microscopy (AFM) and scanning tunneling microscopy (STM) provide real space images of a crystal surface with atomic scale resolutions. However, the basic principles of AFM and STM are quite different: i.e., AFM is based on the interatomic forces between the AFM tip atoms and surface atoms whereas, STM is based on the tunneling currents between them. Since the interatomic forces do not depend on the details of the electronic structures of the tip and the surface as the tunneling currents do, the interpretation of an AFM image is generally believed to be much simpler than that of an STM image.

For the interpretation of an AFM image or an STM image, conventional theories make several simplifying assumptions which provide approximate descriptions of the AFM and the STM processes. In the AFM process, the surface atoms are assumed to deform elastically under the force applied by an AFM tip, and the tip is generally assumed to be rigid. On the other hand, in the STM process the tip-surface interactions and the surface dynamics are generally ignored. However, the tip-surface interactions and the surface dynamics are crucial for the correct interpretation of the symmetric dimer image on the Si(100) surface. For example, consider a situation at room temperature in which the STM tip effectively captures a fluctuating surface dimer in an up-flip asymmetric dimer configuration. In this case, the capture mechanism is possible due to the thermal fluctuations of the dimer configuration, and as the STM tip moves away from the surface dimer, the dimer resumes its normal thermal fluctuations between the up-flip and the down-flip configurations.

Accordingly, ab initio total energy pseudopotential calculations are utilized to study the microscopic deformations associated with intimate AFM on the Si(100) surface. The calculations show that for a tip-surface distance of about 2Å another capture mechanism associated with tip-surface interactions is operational in which an AFM tip can capture a surface dimer in the down-flip configuration and pull it up to the up-flip configuration. This second mechanism leads to a plastic deformation of the surface dimer when the thermal fluctuations of the dimer are suppressed. This suppression can occur conservatively for temperatures lower than 24K, or at higher temperatures if the dimer is in the vicinity of a defect.

In the *ab initio* total energy pseudopotential calculations, the local density approximation (LDA) of the density functional theory is used to minimize the electronic energy using the preconditioned conjugate gradients scheme. The LDA calculations are performed with the Perdew-Zunger parameterized exchange-correlation energy (discussed in Perdew et al., Phys. Rev. B 23, 5048 (1981), and incorporated herein by reference), and the Kleinman-Bylander separable form of optimized pseudopotentials (discussed in Kleinman et al., Phys. Rev. Lett. 48, 1425 (1982), and incorporated herein by reference).

The tip-surface system is modeled by a supercell (15.35Å × 8.58Å × 16.00Å), and the plane wave cutoff energy is chosen to be $E_c = 300$eV. This system requires a fast Fourier transform (FFT) box size of $128 \times 64 \times 128$ and 33699 plane wave basis functions. The Brillouin zone sampling is performed with one k point ($\Gamma$).

The supercell contains 32 silicon atoms that form a four layer slab with eight atoms in each layer, 16 hydrogen atoms that are used to passivate the dangling bonds of the bottom layer silicon atoms, and 4 tungsten atoms that are used as a tip. The top layer silicon atoms form a c(4×2) surface reconstruction, and the bottom layer silicon atoms are fixed at bulk positions. The vacuum region between the silicon slab and its periodic image is 10Å. The apex of the AFM tip is modeled by a tungsten tetradehron cluster, and the cluster is placed in the vacuum region with an apex directed down to the silicon surface.

The tip is placed directly above a lower dimer atom, and the calculations are performed in two sequences of tip-surface distances, the capture sequence (5.2Å, 4.3Å, 4.2Å, 3.95Å, 3.7Å, and 3.2Å) and the pull-up sequence (3.2Å, 4.35Å, 4.45Å, 5.2Å). For each calculation with a fixed tip-surface distance, the tungsten atom at the apex of the tip and top three layers of silicon atoms are allowed to relax according to the Hellman-Feynman forces (discussed in Payne et al., Rev. Mod. Phys. 64, 1045 (1992), and incorporated herein by reference) so that the three tip atoms and the bottom layer silicon atoms play the role of the macroscopic and the bulk silicon crystal. The atoms are relaxed until the Hellman-Feynman forces are smaller than 0.1eV/Å. The force on the AFM tip is then calculated from the Hellman-Feynman forces on the three fixed tip atoms.

The results of the calculations are summarized with reference again to FIGS. 3A–3D. FIGS. 3A and 3B show charge density cross sections of the initial and the final states of the capture sequence. At the tip-surface distance (h) of 3.2Å, the dimer is captured by the tip, and the bonding charge is visible between the tip atom and the dimer atoms. FIGS. 3C and 3D show an intermediate and the final states of the pull-up sequence. By these two sequences of tip movement the dimer is flipped from the down-configuration to the up-configuration.

The relaxation of the tip-surface system shows that the intrinsic dimer structure on the Si(100) surface determines the response of the surface atoms to the force applied by the tip. The double potential well structure of the dimer configuration makes it possible for a dimer to stay in either local minimum energy configuration and leads to a change of the surface structure under the influence of the AFM or STM tip. In the absence of the thermal flipping of the dimer at a low temperature, the surface dimer will stay in the deformed configuration even after the tip moves away from the dimer. Therefore, this mechanism leads to a microscopic scale plastic deformation of the Si(100) surface.

Generally, this type of plastic deformation of the surface is expected to happen for any reconstructed surfaces with the reconstruction unit which has multiple minimum energy configurations. An AFM or STM tip can induce a transition between local minimum energy configurations by lowering the potential barrier and stabilizing one configuration as shown.

Furthermore, there is an indication that a bond is formed between the tip apex atom and a surface dimer atom, and this bonding is responsible to the change of dimer geometry between local minimum energy configurations. The tip-surface bonding length is about 2.35Å and changes only 0.05Å as the tip moves over the range of 3Å. This stability of the tip-surface bond is combined with the surface dimer structure to produce a complicated relaxation of the tip-surface system. Therefore, most generally the microscopic process of a low temperature AFM experiment involves a complicated relaxation of the tip and surface system which depends on the intrinsic surface structures and the tip-surface interactions.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A memory device comprising:
   a storage medium including a substrate with a surface configuration having a plurality of asymmetric surface dimers, each having a lower atom and an upper atom positioned at a dimer angle with respect to one another; and
   means for writing data into said storage medium by modifying the configuration of said surface dimers, said writing means including a probing tip which in response to being placed in intimate contact with the lower atom of a selected dimer results in an interatomic bond which accommodates pulling the lower atom upward and thus pulling the upper atom downward so as to effect a change in the dimer angle.

2. The memory device of claim 1, wherein said substrate comprises a structure with a (100) surface of a diamond structure.

3. The memory device of claim 1, wherein each surface dimer stores one bit of data.

4. The memory device of claim 1 further comprising a housing for enclosing said substrate.

5. The memory device of claim 4, wherein said housing comprises a low temperature, high vacuum chamber.

6. The memory device of claim 1, wherein said writing means comprises an atomic force microscope.

7. The memory device of claim 1, further comprising means for reading the modified configuration of said surface dimers.

8. The memory device of claim 7, wherein said reading means comprises an atomic force microscope.

9. The memory device of claim 7, wherein said reading means comprises a scanning tunneling microscope.

10. The memory device of claim 9, wherein said reading means is operable for determining the modified configuration of said surface dimers by measuring the tunneling current of said surface dimers.

11. The memory device of claim 1, wherein said interatomic bond is produced between said probing tip and the lower atom of the selected dimer when the distance therebetween approaches less than 3Å.

12. A method of storing data comprising the steps of:
    providing a substrate with a surface configuration having a plurality of asymmetric surface dimers as a storage medium, each dimer having a lower atom and an upper atom positioned at a dimer angle with respect to one another; and
    writing data into said storage medium by modifying the configuration of said surface dimers, said writing being achieved by a probing tip which in response to being placed in intimate contact with the lower atom of a selected dimer results in an interatomic bond which accommodates pulling the lower atom upward and thus pulling the upper atom downward so as to effect a change in the dimer angle.

* * * * *

UNITED STATES PATENT AND TRADEMARK OFFICE
CERTIFICATE OF CORRECTION

PATENT NO.   : 5,448,514
DATED        : September 5, 1995
INVENTOR(S)  : Cho, Kygeongjae and Joannopoulos, John D.

It is certified that error appears in the above-indentified patent and that said Letters Patent is hereby corrected as shown below:

Column 1, Line 6, insert the following paragraph:
-- This invention was made with government support under Grant No. N00014-90-J-1370 awarded by The United States Navy and Contract Number DAAL03-92-C-0001 awarded by The United States Army. The government has certain rights in the invention. --

Signed and Sealed this

Twentieth Day of February, 1996

Attest:

BRUCE LEHMAN

Attesting Officer

Commissioner of Patents and Trademarks